United States Patent
Chen et al.

(10) Patent No.: US 9,735,248 B2
(45) Date of Patent: Aug. 15, 2017

(54) PURE BORON FOR SILICIDE CONTACT

(71) Applicant: INTERNATIONAL BUSINESS MACHINES CORPORATION, Armonk, NY (US)

(72) Inventors: Chia-Yu Chen, White Plains, NY (US); Zuoguang Liu, Schenectady, NY (US); Sanjay C. Mehta, Niskayuna, NY (US); Tenko Yamashita, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/248,002

(22) Filed: Aug. 26, 2016

(65) Prior Publication Data

US 2017/0033193 A1  Feb. 2, 2017

Related U.S. Application Data

(63) Continuation of application No. 14/812,399, filed on Jul. 29, 2015, now Pat. No. 9,484,431.

(51) Int. Cl.
*H01L 29/45* (2006.01)
*H01L 29/08* (2006.01)
(Continued)

(52) U.S. Cl.
CPC .......... *H01L 29/456* (2013.01); *H01L 21/225* (2013.01); *H01L 21/2251* (2013.01); *H01L 21/2252* (2013.01); *H01L 21/28518* (2013.01); *H01L 21/3065* (2013.01); *H01L 21/31111* (2013.01); *H01L 21/31116* (2013.01); *H01L 21/76805* (2013.01); *H01L 21/76814* (2013.01); *H01L 21/76831* (2013.01); *H01L 21/76843* (2013.01); *H01L 21/76877* (2013.01); *H01L 21/76895* (2013.01); *H01L 21/823814* (2013.01); *H01L 21/823871* (2013.01);
(Continued)

(58) Field of Classification Search
CPC . H01L 29/456; H01L 29/0847; H01L 29/167; H01L 29/401; H01L 29/41725; H01L 29/4175; H01L 29/41766; H01L 29/41775; H01L 29/41783; H01L 29/45; H01L 29/495; H01L 29/516; H01L 29/517; H01L 29/665; H01L 29/66628; H01L 29/66636; H01L 29/7848; H01L 23/485

See application file for complete search history.

(56) References Cited

U.S. PATENT DOCUMENTS

| | | | | |
|---|---|---|---|---|
| 7,390,707 B2 * | 6/2008 | Kawamura | ....... | H01L 21/26506 257/E21.165 |
| 8,709,890 B2 * | 4/2014 | Cheng | ..................... | H01L 21/84 257/296 |

(Continued)

*Primary Examiner* — Ida M Soward
(74) *Attorney, Agent, or Firm* — Cantor Colburn LLP; Vazken Alexanian

(57) ABSTRACT

A semiconductor device includes a gate disposed over a substrate; a source region and a drain region on opposing sides of the gate; and a pair of trench contacts over and abutting an interfacial layer portion of at least one of the source region and the drain region; wherein the interfacial layer includes boron in an amount in a range from about $5 \times 10^{21}$ to about $5 \times 10^{22}$ atoms/cm$^2$.

20 Claims, 11 Drawing Sheets

(51) Int. Cl.
 *H01L 29/16*    (2006.01)
 *H01L 29/40*    (2006.01)
 *H01L 29/41*    (2006.01)
 *H01L 29/49*    (2006.01)
 *H01L 29/51*    (2006.01)
 *H01L 29/66*    (2006.01)
 *H01L 29/78*    (2006.01)
 *H01L 23/48*    (2006.01)
 *H01L 21/768*    (2006.01)
 *H01L 21/225*    (2006.01)
 *H01L 29/417*    (2006.01)
 *H01L 21/8238*    (2006.01)
 *H01L 21/3065*    (2006.01)
 *H01L 21/311*    (2006.01)
 *H01L 29/167*    (2006.01)
 *H01L 21/285*    (2006.01)
 *H01L 23/485*    (2006.01)

(52) U.S. Cl.
 CPC ........ *H01L 23/485* (2013.01); *H01L 29/0847* (2013.01); *H01L 29/167* (2013.01); *H01L 29/401* (2013.01); *H01L 29/4175* (2013.01); *H01L 29/41725* (2013.01); *H01L 29/41766* (2013.01); *H01L 29/41775* (2013.01); *H01L 29/41783* (2013.01); *H01L 29/45* (2013.01); *H01L 29/495* (2013.01); *H01L 29/516* (2013.01); *H01L 29/517* (2013.01); *H01L 29/665* (2013.01); *H01L 29/66628* (2013.01); *H01L 29/66636* (2013.01); *H01L 29/78* (2013.01); *H01L 29/7848* (2013.01)

(56) References Cited

U.S. PATENT DOCUMENTS

| | | | | |
|---|---|---|---|---|
| 8,975,142 | B2* | 3/2015 | Paul | H01L 29/66795 257/288 |
| 9,018,714 | B2* | 4/2015 | Cheng | H01L 21/823807 257/377 |
| 9,543,216 | B2* | 1/2017 | Niimi | H01L 21/823871 |
| 2013/0001555 | A1* | 1/2013 | Yin | H01L 21/28518 257/52 |
| 2014/0306290 | A1* | 10/2014 | Alptekin | H01L 29/41725 257/369 |
| 2016/0104673 | A1* | 4/2016 | Tung | H01L 21/76897 257/288 |
| 2016/0351566 | A1* | 12/2016 | Niimi | H01L 21/823418 |
| 2017/0005173 | A1* | 1/2017 | Ando | H01L 29/42356 |

* cited by examiner

PURE BORON FOR SILICIDE CONTACT

This application is a continuation of and claims priority from U.S. patent application Ser. No. 14/812,399, filed on Jul. 29, 2015, entitled "PURE BORON FOR SILICIDE CONTACT," the entire contents of which are incorporated herein by reference.

BACKGROUND

The present invention generally relates to metal-oxide-semiconductor field-effect transistors (MOSFET), and more specifically, to source/drain contact structures.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are complementary MOSFETs. The NFET uses electrons as the majority current carriers and is built directly on a p-type substrate with n-doped source and drain junctions (also called epitaxial contacts) and an n-doped gate. The PFET uses holes as the majority current carriers and is built on an n-well with p-doped source and drain junctions (epitaxial contacts) and a p-doped gate. The dopant concentration in the source and drain junctions is an important parameter for optimal transistor function.

SUMMARY

In one embodiment of the present invention, a semiconductor device includes a gate disposed over a substrate; a source region and a drain region on opposing sides of the gate; and a pair of trench contacts over and abutting an interfacial layer portion of at least one of the source region and the drain region; wherein the interfacial layer includes boron in an amount in a range from about $5 \times 10^{21}$ to about $5 \times 10^{22}$ atoms/cm$^2$.

In another embodiment, a method of making a semiconductor device includes performing an epitaxial growth process to form epitaxial contacts on opposing sides of a gate positioned over a substrate; removing portions of the epitaxial contacts to form trench contact patterns; depositing a conformal layer including amorphous boron within the trench contact patterns, the conformal layer forming a discrete interfacial layer within the epitaxial contacts, and the discrete interfacial layer including boron in an amount in a range from about $5 \times 10^{21}$ to about $5 \times 10^{22}$ atoms/cm$^2$; removing the conformal layer including amorphous boron; and filling the trench contact patterns with a high-k dielectric material and a conductive metal to form the trench contacts.

Yet, in another embodiment, a method of making a semiconductor device includes performing an epitaxial growth process to form epitaxial contacts on opposing sides of a gate positioned over a substrate; removing portions of the epitaxial contacts to form trench contact patterns; performing a deposition process to deposit a conformal layer including substantially pure amorphous boron within the trench contact patterns, the conformal layer forming a discrete interfacial layer within the epitaxial contacts comprising boron in an amount in a range from about $5 \times 10^{21}$ to about $5 \times 10^{22}$ atoms/cm$^2$; removing the conformal layer including amorphous boron; and filling the trench contact patterns with a high-k dielectric material and a conductive metal to form the trench contacts.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-7 illustrate an exemplary method of making a PFET source/drain contact according to embodiments the present invention, in which:

FIG. 1 is a cross-sectional side view of a semiconductor device with a PFET and a NFET formed over a substrate;

FIG. 2 is a cross-sectional side view after performing an etching process to form trench contacts over the source/drain regions;

FIG. 3 is a cross-sectional side view after lithographic patterning to block the NFET region;

FIG. 7 is a cross-sectional side view after depositing a gate contact liner and conductive gate material.

DETAILED DESCRIPTION

Figure 1:
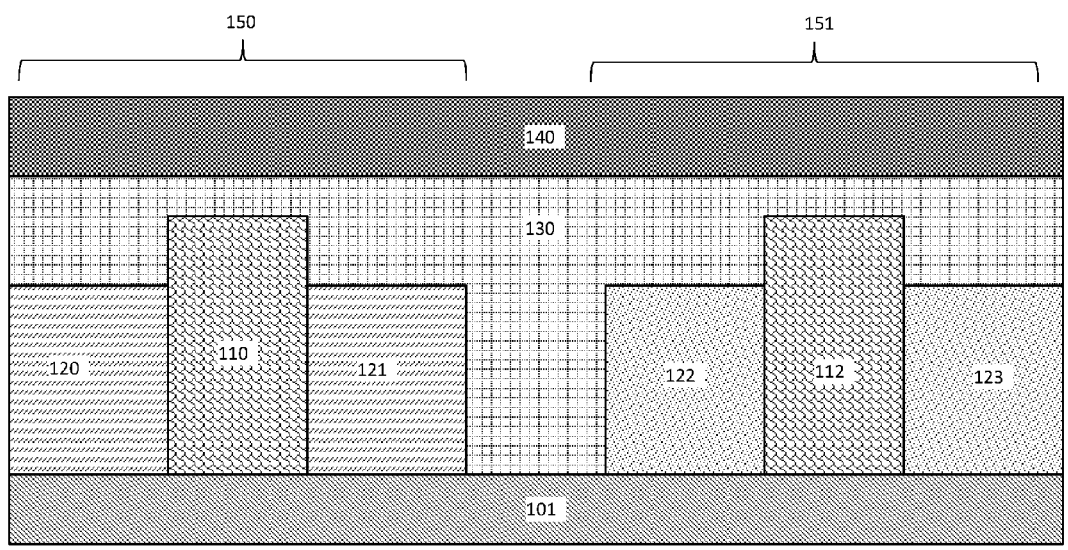

Although the dopant concentration (e.g., boron (B) concentration) can significantly improve functioning at the PFET source/drain contact, the ability to increase the dopant concentration by ion implantation or other methods (e.g., in-situ based doping) is limited to an upper limit of about $5 \times 10^{20}$ atoms/centimeter$^2$ (atoms/cm$^2$).

Accordingly, embodiments of the present invention provide a PFET source/drain contact with a high boron concentration in silicon (Si) or silicon germanium (SiGe), up to about $3 \times 10^{22}$ atoms/cm$^2$. Further, the boron mixes with the Si or SiGe with to provide high activity in the contact because a high boron concentration provides decreased resistance. A method of making the PFET source/drain contact with a high boron concentration (e.g., $1 \times 10^{19}$ to about $1 \times 10^{21}$ atoms/cm$^2$) is now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-7 illustrate an exemplary method of making a PFET source/drain contact according to embodiments of present invention. FIG. 1 is a cross-sectional side view of a semiconductor device with a NFET 150 and a PFET 151 formed over a common substrate 101. Non-limiting examples of suitable substrate materials include silicon, silicon dioxide, aluminum oxide, sapphire, germanium, gallium arsenide (GaAs), an alloy of silicon and germanium, indium phosphide (InP), or any combination thereof. Other examples of suitable substrates 101 include silicon-on-insulator (SOI) substrates with buried oxide (BOX) layers. The thickness of the substrate 101 is not intended to be limited. In one aspect, the thickness of the substrate 101 is in a range from about 2 mm to about 6 mm for bulk semiconductor substrates. In another aspect, the thickness of the substrate 101 is in a range from about 25 nm to about 50 nm for the silicon layer in SOI substrates To form the epitaxial contacts forming the source regions 120 and 122 and the drain region 121 and 123, lithography and etching are performed. Lithography can include depositing a photoresist (not shown) onto the substrate 101 and developing the exposed photoresist with a resist developer to provide a patterned photoresist. The epitaxial contacts are formed by performing an epitaxial growth process to deposit a doped material (e.g., silicon). The type of dopant used depends on whether the MOSFET is the NFET 150 or the PFET 151. Non-limiting examples of suitable dopants for the NFET 150 include n-type dopants (e.g., Group V elements such as phosphorus). Non-limiting examples of suitable dopants for the PFET 151 include p-type dopants (e.g., Group III such as boron). Generally, the concentration of dopant in the epitaxial contacts is in a range from about $1 \times 10^{19}$ to about $1 \times 10^{21}$ atoms/cm$^2$.

The thickness of the epitaxial contacts forming the source regions 120 and 122 and the drain regions 121 and 123 is not intended to be limited. In one aspect, the thickness of the epitaxial contacts is in a range from about 5 nm to about 60 nm. In another aspect, the thickness of the epitaxial contacts is in a range from about 5 nm to about 10 nm.

The gates 110 and 112 are formed by lithographic patterning and etching. Initially, a "dummy gate" is formed by filling the gate region with a suitable removable gate material, for example, amorphous silicon (polysilicon). The removable gate material is subsequently removed, and the gates 110 and 112 are filled with a conductive gate material. A high-k dielectric liner can be deposited before filling with the conductive gate material.

The high-k dielectric material can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Other non-limiting examples of suitable high-k dielectric materials include $HfO_2$, $ZrO_2$, $Al_2O_3$, $TiO_2$, $La_2O_3$, $SrTiO_3$, $LaAlO_3$, $Y_2O_3$, a pervoskite oxide, or any combination thereof. The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Non-limiting examples of suitable conductive gate metals include aluminum (Al), platinum (Pt), silver (Au), tungsten (W), titanium (Ti), or any combination thereof. The conductive metal may be deposited by a known deposition process, for example, CVD, PECVD, PVD, plating, thermal or e-beam evaporation, and sputtering.

The thickness of the gates 110 and 112 is not intended to be limited. In one aspect, the thickness of the gates 110 and 112 is in a range from about 20 nm to about 75 nm. In another aspect, the thickness of the gates 110 and 112 is in a range from about 20 nm to about 50 nm.

A blanket oxide layer 130 is deposited onto both NFET 150 and PFET 151 regions over the substrate 101. Non-limiting examples of suitable materials for the oxide layer 130 include flowable oxides (e.g., liquid solutions of hydrogen silsesquioxane in a carrier solvent) and silicon dioxide. The thickness of the oxide layer 130 is not intended to be limited. In one aspect, the thickness of the oxide layer 130 is in a range from about 50 nm to about 150 nm. In another aspect, the thickness of the oxide layer 130 is in a range from about 60 nm to about 115 nm.

An optional silicon nitride (SiN) layer 140 is deposited onto the oxide layer 130. The thickness of the SiN layer 140 is not intended to be limited. In one aspect, the thickness of the SiN layer 140 is in a range from about 5 nm to about 20 nm. In another aspect, the thickness of the SiN layer 140 is in a range from about 10 nm to about 15 nm.

Figure 2:
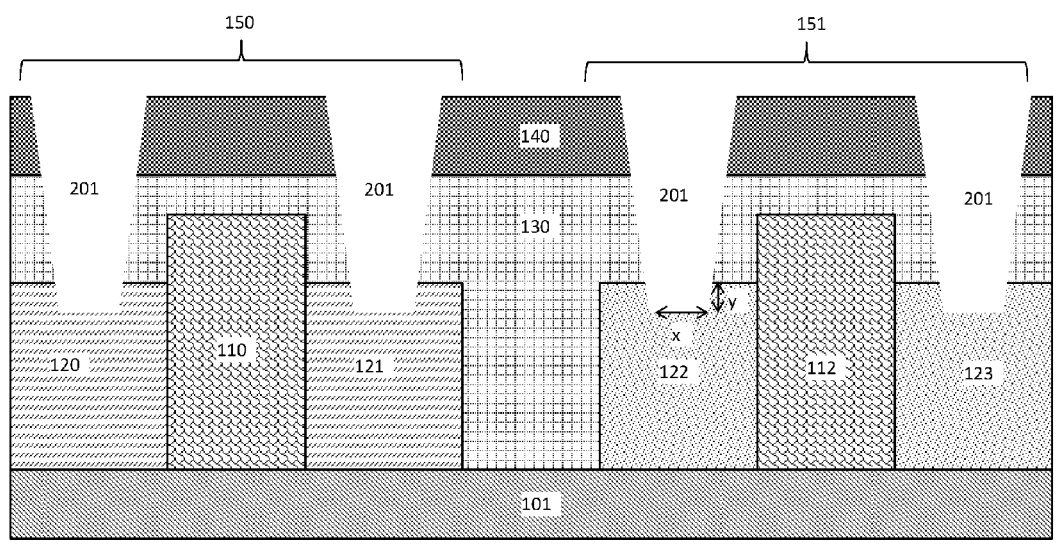

FIG. 2 is a cross-sectional side view after performing an etching process to form trench contacts 201 over the source regions 120 and 122 and drain regions 121 and 123. The etching process may be a dry etching process, for example, reactive ion etching (ME). The etching process is performed through the SiN layer 140, the oxide layer 130, and a portion of the epitaxial contacts of the source regions 120 and 122 and drain regions 121 and 123. The etching process removes a portion of and stops within a region of the epitaxial contacts to form a recess. The open trench contacts 201 form a trench contact pattern. The trench contact patterns have side walls (y) and a base (x) that protrude into the epitaxial contacts of the source region 122 and the drain region 123.

Figure 3:
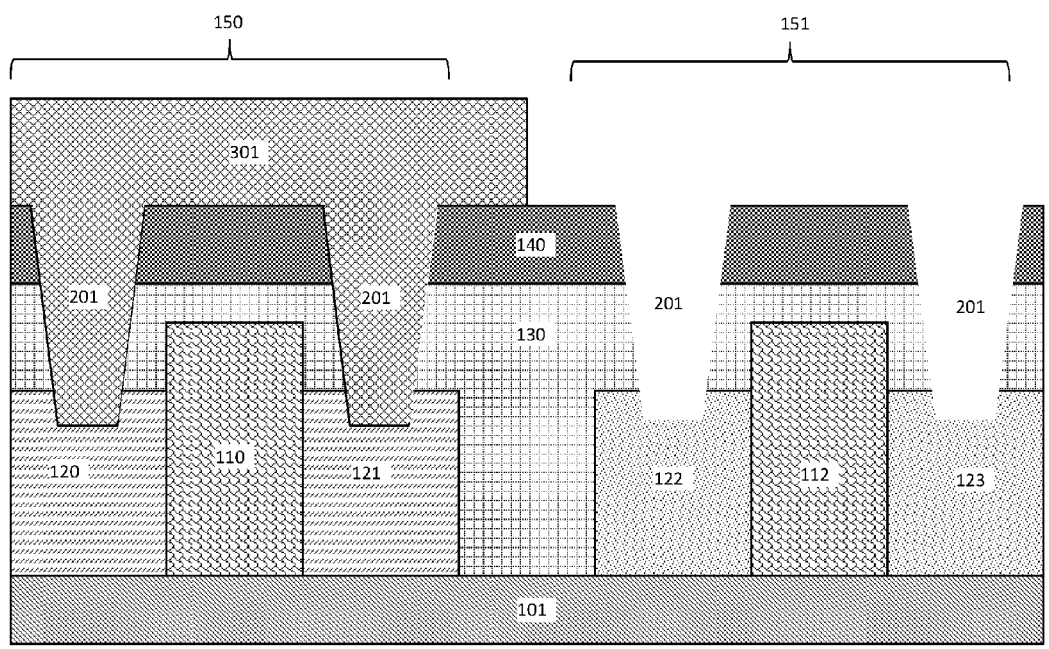

FIG. 3 is a cross-sectional side view after lithographic patterning to block the NFET 150 region. A hard mask layer 301 is deposited over the NFET 150 portion of the substrate 110. The hard mask layer 301 may include, for example, amorphous carbon (a-C), silicon nitride (SiN), or silicon dioxide ($SiO_2$). The hard mask layer 301 fills the open regions of the trench contacts 201.

Figure 4A:
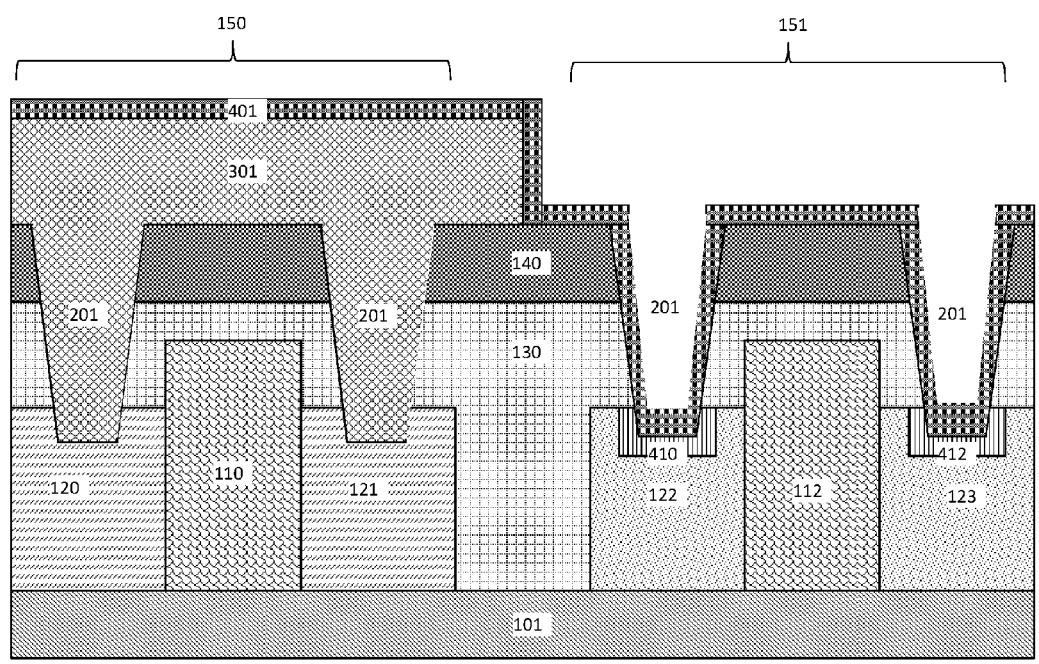
FIG. 4A is a cross-sectional side view after depositing a conformal layer of amorphous boron.

FIG. 4A is a cross-sectional side view after depositing a conformal layer of amorphous boron. The amorphous boron layer 401 is formed by using a deposition process (e.g, CVP or ALD) to deposit a conformal layer of amorphous boron within the trench contacts 201 over the PFET 151. The amorphous boron layer 401 includes substantially pure boron. In one embodiment, the amorphous boron layer 401 includes 100 atomic % (at. %) boron. In another embodiment, the amorphous boron layer 401 includes at least 99 at. % boron. Yet, in another embodiment, the amorphous boron layer 401 includes at least 98 at. % boron.

Deposition of the amorphous boron layer 401 may be performed by Chemical Vapor Deposition (CVD). The conditions of the CVD process may be tailored to the particular semiconductor device. The CVD process may be performed at atmospheric pressure (i.e., about 760 Torr), or reduced pressures, for example 60 Torr or 36 Torr. In one exemplary embodiment, the deposition is performed at processing temperatures ranging from about 500° C. to about 800° C. Diborane ($B_2H_6$) is injected into the reactor chamber as the dopant gas at a flow rate of, for example, 490 standard cubic centimeters per minute (sccm). Hydrogen gas ($H_2$) may be used as the carrier gas and for dilution of the doping source.

The hard mask layer 301 protects the trench contacts 201 over the NFET 150 region. The amorphous boron layer 401 lines the trench contacts 201 of the PFET 151 and forms an interfacial layer 410 including a high boron concentration in the epitaxial contacts of the source region 122 and drain region 123. The interfacial layer 410 naturally forms in the source region 122 and drain region 123 upon disposing amorphous boron layer 401 within the trench contacts 201.

In one aspect, the interfacial layer 410 has a thickness in a range from about 0.5 nm to about 2 nm. In another aspect, the interfacial layer 410 has a thickness in a range from about 1 nm to about 1.5 nm. Yet, in another aspect, the interfacial layer 410 has a thickness about or in any range from about 0.5, 0.6, 0.7, 0.8, 0.9, 1.0, 1.1., 1.2, 1.3, 1.4, and 1.5 nm.

In one aspect, the interfacial layer 410 has a boron concentration in a range from about $5 \times 10^{21}$ to about $5 \times 10^{22}$ atoms/$cm^2$. In another aspect, the interfacial layer 410 has a boron concentration in a range from about $1 \times 10^{22}$ to about $3 \times 10^{22}$ atoms/$cm^2$.

Figure 4B:
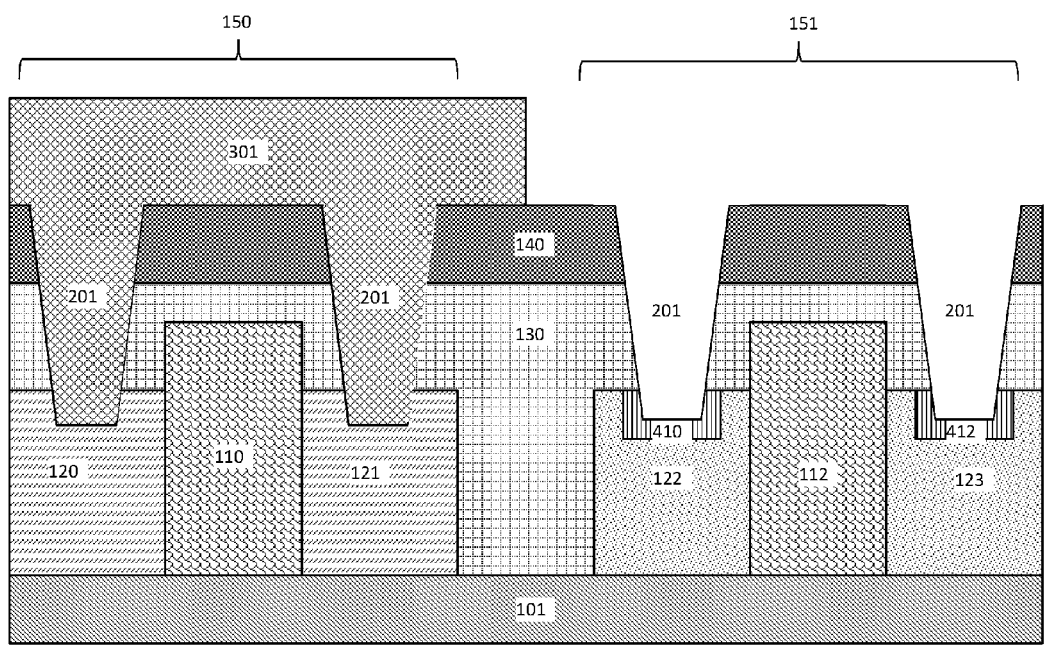
FIG. 4B is a cross-sectional side view after removing the amorphous boron layer.

FIG. 4B is a cross-sectional side view after removing the amorphous boron layer 401. The amorphous boron layer 401 may be removed using any suitable process. Although the amorphous boron layer 401 is stripped, the interfacial layer 410 remains over the source region 122 and the drain region 123. In one non-limiting example, a boiling solution of concentrated nitric acid ($HNO_3$) is used to remove the amorphous boron layer 401. The temperature of the $HNO_3$ can be, for example, 110° Celsius (° C.). The concentration of the $HNO_3$ can be, for example, between about 50 and about 85%. In another non-limiting example, an aqua regia process can be used to remove the amorphous boron layer 401. An aqua regia process involves using a nitro-hydrochloric acid (HCl) to etch away the amorphous boron layer 401. The nitro-HCl mixture is formed by mixing concentrated nitric acid and hydrochloric acid in a volume ratio of, for example, 1:3.

Figure 4C:
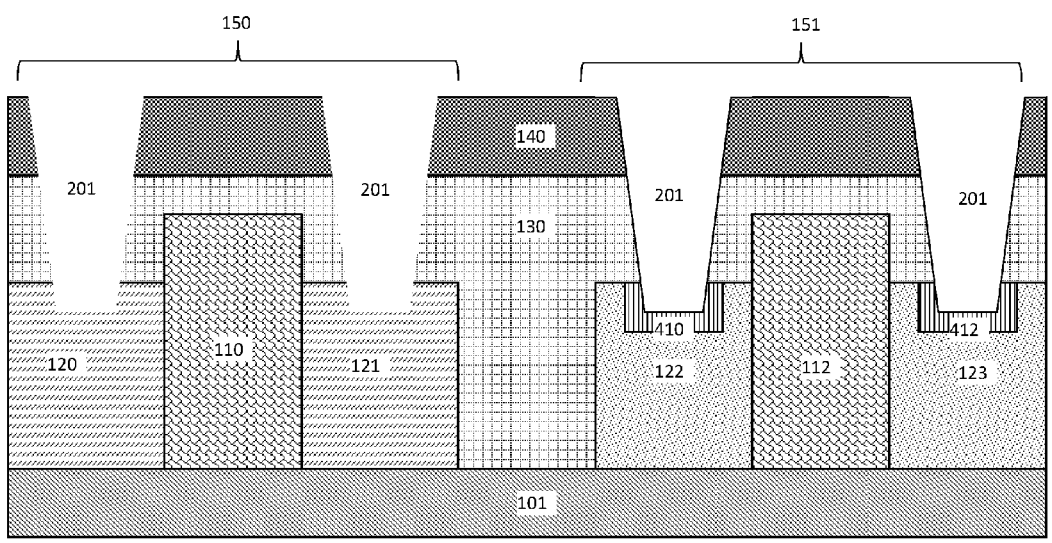
FIG. 4C is a cross-sectional side view after removing the lithographic patterning mask.

FIG. 4C is a cross-sectional side view after removing the hard mask layer 301 over the NFET 150 region. The hard mask layer 301 can be removed by a wet cleaning process using, for example, HF or HCl and dry etching. Suitable dry etching processes include ME, plasma etching, ion beam etching, laser ablation, or any combination thereof.

Figure 5A:
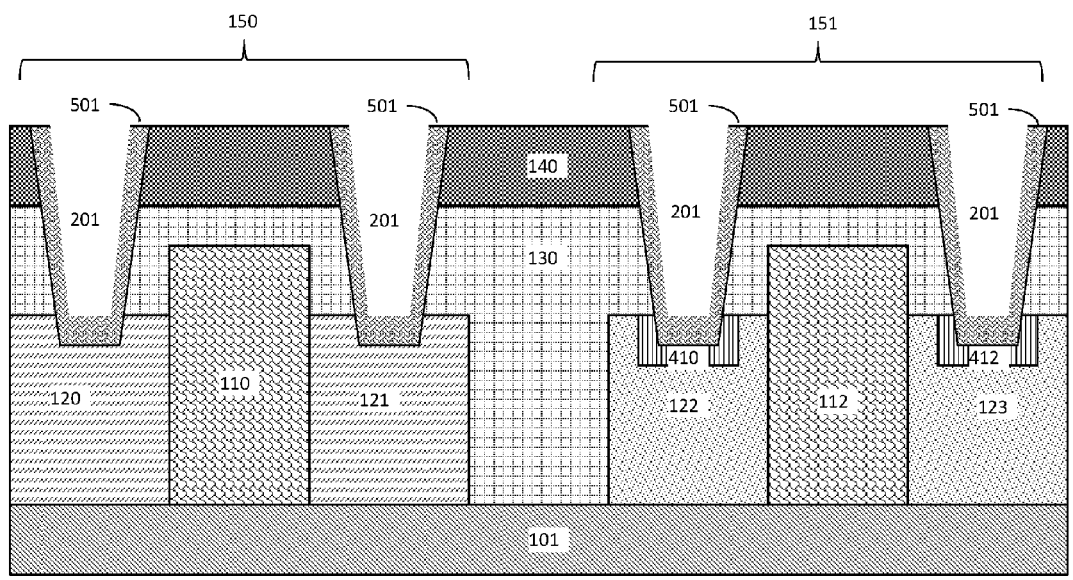
FIG. 5A is a cross-sectional side view after depositing a liner in the trench contacts.

FIG. 5A is a cross-sectional side view after depositing a liner 501 in the trench contacts 201. To form the liner 501, a high-k dielectric material is deposited into the trench contacts. The high-k dielectric material can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Other non-limiting examples of suitable high-k dielectric materials include $HfO_2$, $ZrO_2$, $Al_2O_3$, $TiO_2$, $La_2O_3$, $SrTiO_3$, $LaAlO_3$, $Y_2O_3$, a pervoskite oxide, or any combination thereof. The high-k dielectric material layer may be formed by known deposition processes, for example, CVD, PECVD, ALD, evaporation, PVD, chemical solution deposition, or other like processes. The thickness of the high-k dielectric material may vary depending on the deposition process as well as the composition and number of high-k dielectric materials used.

In one embodiment, the liner 501 includes a bilayer of Ti and TiN. The TiN is deposited over the layer of Ti to form the Ti/TiN liner. The thickness of the liner 501 can generally vary and is not intended to be limited. In one aspect, the thickness of the liner 501 is in a range from about 3 nm to about 10 nm. In another aspect, the thickness of the liner 501 is in a range from about 4 nm to about 9 nm.

Figure 5B:
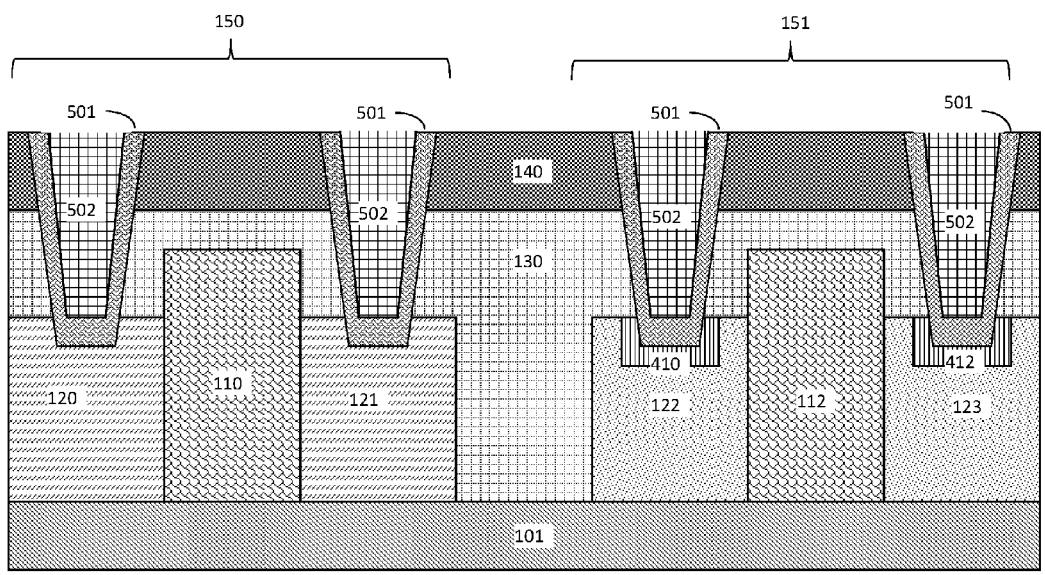
FIG. 5B is a cross-sectional side view after filling the trench contact with a conductive metal.

FIG. 5B is a cross-sectional side view after filling the trench contacts 201 with a conductive metal 501. Non-limiting examples of suitable conductive metals include tungsten, aluminum, platinum, gold, or any combination thereof. A planarization process, for example chemical mechanical planarization (CMP), is performed over the conductive metal 501. The conductive metal may be deposited by a known deposition process, for example, CVD, PECVD, PVD, plating, thermal or e-beam evaporation, and sputtering.

Figure 6A:
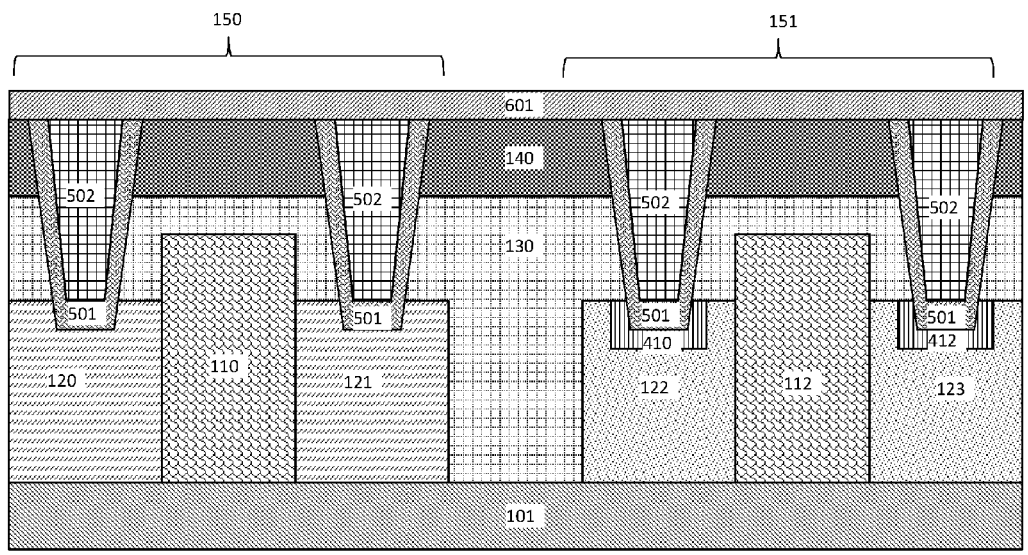
FIG. 6A is a cross-sectional side view after depositing an oxide layer over the semiconductor device.

FIG. 6A is a cross-sectional side view after depositing a blanket oxide layer 601 over the NFET 150 and PFET 151 regions of the semiconductor device. The oxide layer 601 can include, for example, tetraethyl-ortho-silicate (TEOS) or silicon dioxide.

Figure 6B:
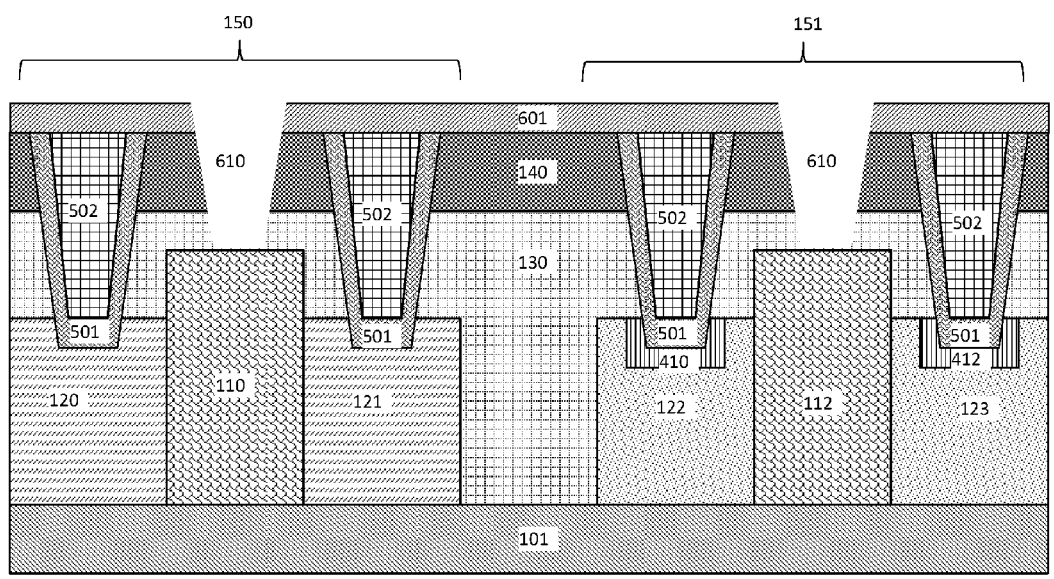
FIG. 6B is a cross-sectional side view after etching to form the gate contact patterns over the gates.

FIG. 6B is a cross-sectional side view after etching to form the gate contact patterns 610 over the gates 110 and 112. In one non-limiting example, a RIE process is performed to form the gate contact patterns 610.

Figure 7:
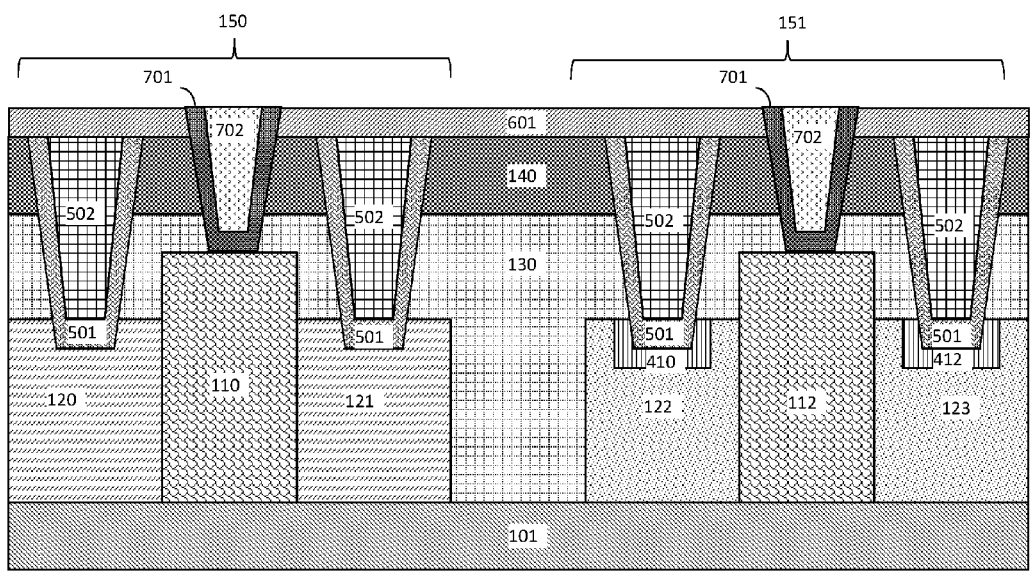

FIG. 7 is a cross-sectional side view after depositing a gate contact liner 701 and conductive gate material 702 into the gate contact patterns 610. The gate contact liner 701 can include, for example, a high-k dielectric material as described above for liner 501 (see FIG. 5A). The conductive gate material 702 can be any of the conductive metal materials described above for the trench contacts 201 (see FIG. 5B). A planarization process, for example, a CMP process, is performed over the conductive gate material 702.

The above described embodiments of semiconductor devices and methods of making such devices provide various advantages. The methods provide a PFET source/drain contact with a high boron concentration in Si or SiGe, up to about $3-5 \times 10^{22}$ atoms/$cm^2$. After depositing a layer of amorphous boron over the source and drain a contact, the boron mixes with the Si or SiGe with to provide high activity in the contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a gate disposed over a substrate;
a source region and a drain region on opposing sides of the gate; and
a pair of trench contacts over and abutting an interfacial layer portion of at least one of the source region and the drain region;
wherein the interfacial layer comprises boron in an amount in a range from about $5 \times 10^{21}$ to about $5 \times 10^{22}$ atoms/cm$^2$.

2. The semiconductor device of claim 1, wherein the pair of trench contacts is positioned within a recessed region of the epitaxial contacts.

3. The semiconductor device of claim 1, wherein the interfacial layer has a thickness in a range from about 0.5 to about 2 nanometers (nm).

4. The semiconductor device of claim 1, wherein the trench contacts have sidewalls that contact the interfacial layer.

5. The semiconductor device of claim 1, wherein the semiconductor device is a p-type field effect transistor (PFET).

6. The semiconductor device of claim 1, wherein the trench contact comprises a high-k dielectric material.

7. The semiconductor device of claim 6, wherein the high-k dielectric material contacts the interfacial layer.

8. The semiconductor device of claim 6, wherein the trench contact further comprises a conductive metal.

9. The semiconductor device of claim 8, wherein the conductive metal is tungsten, aluminum, platinum, gold, or any combination thereof.

10. The semiconductor device of claim 6, wherein the high-k dielectric material is $HfO_2$, $ZrO_2$, $Al_2O_3$, $TiO_2$, $La_2O_3$, $SrTiO_3$, $LaAlO_3$, $Y_2O_3$, a pervoskite oxide, or any combination thereof.

11. The semiconductor device of claim 1, wherein the trench contacts have a base that contacts the interfacial layer.

12. The semiconductor device of claim 1, wherein the interfacial layer comprises at least 99 atomic % boron.

13. The semiconductor device of claim 1, wherein the interfacial layer comprises boron in an amount in a range from about $1 \times 10^{22}$ to about $3 \times 10^{22}$ atoms/cm$^2$.

14. The semiconductor device of claim 1, wherein the interfacial layer comprises 100 atomic % boron.

15. The semiconductor device of claim 1, wherein the interfacial layer comprises at least 98 atomic % boron.

16. The semiconductor device of claim 1, wherein the substrate comprises silicon.

17. The semiconductor device of claim 1, wherein the substrate comprises silicon germanium.

18. The semiconductor device of claim 1, wherein the source region comprises epitaxial growth.

19. The semiconductor device of claim 1, wherein the drain region comprises epitaxial growth.

20. The semiconductor device of claim 1, wherein the interfacial layer has a thickness in a range from about 1 nm to about 1.5 nm.

* * * * *